United States Patent
Fujita et al.

(10) Patent No.: US 10,162,912 B2
(45) Date of Patent: Dec. 25, 2018

(54) FRICTION IDENTIFICATION METHOD AND FRICTION IDENTIFICATION DEVICE

(71) Applicant: Mitsubishi Electric Corporation, Chiyoda-ku (JP)

(72) Inventors: Tomoya Fujita, Chiyoda-ku (JP); Kotaro Nagaoka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 392 days.

(21) Appl. No.: 15/026,530

(22) PCT Filed: Sep. 17, 2014

(86) PCT No.: PCT/JP2014/074589
§ 371 (c)(1),
(2) Date: Mar. 31, 2016

(87) PCT Pub. No.: WO2015/083417
PCT Pub. Date: Jun. 11, 2015

(65) Prior Publication Data
US 2016/0239594 A1  Aug. 18, 2016

(30) Foreign Application Priority Data
Dec. 6, 2013 (JP) ................. 2013-253451

(51) Int. Cl.
*G06F 17/11* (2006.01)
*G06F 17/50* (2006.01)
*G05B 19/404* (2006.01)

(52) U.S. Cl.
CPC ....... *G06F 17/5009* (2013.01); *G05B 19/404* (2013.01); *G06F 17/11* (2013.01);
(Continued)

(58) Field of Classification Search
CPC ... G06F 17/5009; G06F 17/11; G05B 19/404; G05B 2219/43022; G05B 2219/41154
(Continued)

(56) References Cited

U.S. PATENT DOCUMENTS

2008/0012520 A1   1/2008  Matsumoto et al.
2014/0202018 A1*  7/2014  Barkman ............... G01B 5/24
                                              33/645

FOREIGN PATENT DOCUMENTS

JP    60-116004 A    6/1985
JP    2006-20487 A   1/2006
(Continued)

OTHER PUBLICATIONS

International Search Report dated Oct. 21, 2014 in PCT/JP2014/074589 filed on Sep. 17, 2014.

*Primary Examiner* — Saif A Alhija
(74) *Attorney, Agent, or Firm* — Oblon, McClelland, Maier & Neustadt, L.L.P.

(57) ABSTRACT

A friction identification method includes: measuring a relation between a driving force and a position of a driven object; identifying a parameter of a position-dependent friction model based on a relation between a driving force and a position of the driven object; measuring a relation between a driving force and a displacement of the driven object from a position at which a motion direction is reversed; identifying a parameter of a displacement-dependent friction model; measuring a relation between a driving force and a velocity of the driven object; identifying a parameter of a velocity-dependent friction model; measuring a relation between a driving force and an acceleration of the driven object; and identifying a parameter of an acceleration-dependent friction model.

12 Claims, 11 Drawing Sheets

(52) U.S. Cl.
CPC ............... *G05B 2219/41154* (2013.01); *G05B 2219/43022* (2013.01)

(58) Field of Classification Search
USPC .......................................................... 703/2
See application file for complete search history.

(56) References Cited

FOREIGN PATENT DOCUMENTS

| | | |
|---|---|---|
| JP | 2007-257515 A | 10/2007 |
| JP | 2008-210273 A | 9/2008 |
| JP | 2011-175308 A | 9/2011 |
| JP | 2011-221612 A | 11/2011 |
| WO | 2014/091840 A1 | 6/2014 |

\* cited by examiner

FIG.5

POSITION-DEPENDENT MODEL

| POSITION [mm] | FRICTION CORRECTION COMMAND [N] |
|---|---|
| 100 | 0.5 |
| 80 | 0.4 |
| 60 | -0.2 |
| 40 | 0.2 |
| 20 | 0.1 |
| 0 | 0 |
| -20 | 0.1 |
| -40 | -0.4 |
| -60 | -0.5 |
| -80 | 0.2 |
| -100 | 0.1 |

DISPLACEMENT-DEPENDENT MODEL

| DISPLACE-MENT [mm] | FRICTION CORRECTION COMMAND [N] |
|---|---|
| 100 | 0.35 |
| 80 | 0.32 |
| 60 | 0.3 |
| 40 | 0.25 |
| 20 | 0.2 |
| 0 | 0 |
| -20 | -0.3 |
| -40 | -0.32 |
| -60 | -0.35 |
| -80 | -0.36 |
| -100 | -0.36 |

VELOCITY-DEPENDENT MODEL

| VELOCITY [mm/min] | FRICTION CORRECTION COMMAND [N] |
|---|---|
| 8000 | 0.3 |
| 5000 | 0.25 |
| 1000 | 0.2 |
| 500 | 0.25 |
| 100 | 0.2 |
| 0 | 0 |
| -100 | -0.2 |
| -500 | -0.25 |
| -100 | -0.2 |
| -5000 | -0.25 |
| -8000 | -0.3 |

ACCELERATION-DEPENDENT MODEL

| ACCELERATION [G] | FRICTION CORRECTION COMMAND [N] |
|---|---|
| 2 | 0.35 |
| 1 | 0.32 |
| 0.5 | 0.3 |
| 0.1 | 0.25 |
| 0.05 | 0.2 |
| 0 | 0 |
| -0.05 | -0.3 |
| -0.1 | -0.32 |
| -0.5 | -0.35 |
| -1 | -0.36 |
| -2 | -0.36 |

FRICTION IDENTIFICATION METHOD AND FRICTION IDENTIFICATION DEVICE

FIELD

The present invention relates to a function of correcting a friction by using a model for a device, which controls the position and velocity highly accurately, such as a robot or a machine tool. More particularly, the present invention relates to a friction identification method and a friction identification device that identify a parameter of a friction model in which a plurality of state amounts of the device are used as an input variable.

BACKGROUND

In a machine tool, a plurality of feed shafts are provided, which are driven by a linear motor and a servo motor. A feedback control is executed on each of the feed shafts, in which in order that the actual position of a driven object, such as at table on which a workplace is fixed, corresponds with a command position, a position detector is used to detect the position of the driven object so as to correct the error between the command position and the detected position of the driven object. In the feedback control, even though an unknown disturbance is input, a driving force is controlled so as to cancel out the disturbance. However, upon detecting the error, a driving force is input according to this error, and therefore there is a problem of a delay in response of the feed shaft.

The influence of a friction force, which is a type of the disturbance force, on the accuracy of contouring motion has been well known. For example, in a case of motion along an arc path using two shafts perpendicular to each other on the X-Y plane, each of the two shafts is given a sine-wave root ion command with a 90-degree phase shift. At the point at which the quadrant of the arch changes over to another quadrant, the motion direction of either one of the feed shafts is reversed. At this time, the direction of a friction torque and a friction force is also reversed, which are generated at a contact portion such as a ball screw or a bearing that is a constituent element of the feed shaft. Therefore, the control system for the reversing shaft responds with a delay of a given time. This causes a following error on a response path. The actual path passes along the slightly outer side of a command path. This phenomenon is referred to as "quadrant error", which is a cause of reduction in motion accuracy.

A friction torque of a rotational system, and a friction force of a linear-motion system can be equivalently converted by a constant determined from the configuration of a mechanical system. Therefore, in the specification of the present invention, a friction torque and a friction force are not distinguished from each other. Also, a motor thrust of a linear-motion motor and a motor torque of a rotational motor are not distinguished from each other.

In order to solve the problem of degradation of the motion accuracy caused by the influence of a disturbance including a friction, there has been a known model-based disturbance correction method. In this method, a disturbance is estimated using a model, and a correction force that is required to cancel out the influence of the disturbance is input to a control system for a motor. For example, there is a method as disclosed in Patent Literature 1, to output a current correction command in a pulse waveform having a predetermined width for a predetermined time upon detecting a reversal of the motion direction. For another example, there is a method, disclosed in Patent Literature 2, to output a correction force expressed as a non-linear function to which the position of a driven object is input. In Patent Literature 3, two friction models are used in combination, which are a Coulomb friction, and a viscous friction that is proportional to the velocity.

In a device having a model-based disturbance correcting function, it is necessary to measure in advance a disturbance force generated in the device, and identify a model parameter to be used for the correction. In Patent Literature 1, based on the motion-error amount measured in advance, a pulse width and a pulse time of a correction command are determined. In Patent Literature 2, a relation between the motor current and the position at the time of reversing the motion direction is identified as a single-input single-output function. In Patent Literature 3, an identification algorithm is used to identify two constants that are a Coulomb-friction coefficient and a viscous-friction coefficient.

As disclosed in the following patent literatures, in a case where there are less factors of a disturbance model to be identified, or where a linear model is used, it is possible to identify a parameter of the disturbance model by means of relatively simplified measurement.

CITATION LIST

Patent Literatures

Patent Literature 1: Japanese Patent Application Laid-open No. S60-116004
Patent Literature 2: Japanese Patent Application Laid-open No. 2008-210273
Patent Literature 3: Japanese Patent Application Laid-open No. 2006-20487

SUMMARY

Technical Problem

However, according to the above conventional techniques, in a case where there are many model parameters to be identified, where inputs of a plurality of state amounts are taken into account, or where non-linear characteristics are taken into account, there is a problem that it is difficult to identify a model parameter through a simple process.

It has been commonly known that the actual friction phenomenon varies according to the distance from a predetermined reference point such as the origin point (hereinafter, simply expressed as "position"), the movement amount from the position at which the motion direction is reversed (hereinafter, simply expressed as "displacement"), the velocity, and the acceleration, and also this actual friction phenomenon shows non-linear characteristics relative to the position, displacement, velocity, and acceleration, respectively. For example, the dependency of a friction on the displacement has been known as having hysteresis-loop characteristics shown by the relation between the friction and the displacement amount in a minute-displacement region, and having Coulomb-friction characteristics in a large-displacement region. Further, as the dependency of a friction on the velocity, the Stribeck curve shown by the relation between the velocity and the friction force has been well known.

As described above, the friction force shows a non-linear behavior relative to a change in each state amount. However, there is a problem in that the relevance, such as now the friction force change as relative to each of the position, displacement, velocity, and acceleration changes, has not yet been clarified. Also, there is a problem in that a friction identification method to separate and identify these friction characteristics from each other with respect to each influential state amount has not yet been established. For example, in Patent Literature 1, a friction model can be identified by only a pulse-width parameter and a pulse-time parameter. Therefore, Patent Literature 1 cannot deal with a change in the friction due to a change in the velocity or the displacement. In Patent Literature 2, a friction, relative to the position is identified using a non-linear function. However, Patent Literature 2 does not refer to a friction force that can change due to the influence of the velocity, which is supposed to be present simultaneously. In Patent Literature 3, a Coulomb friction or a viscous friction that can change according to the displacement and velocity is taken into account. However, with respect to both of the frictions, non-linear characteristics are not taken into account.

The present invention has been achieved to solve the above problems, and an object of the present invention is to provide a friction identification method and a friction identification device that separate influences of respective state-amount changes on friction characteristics that vary depending on a position, a displacement, a velocity, and an acceleration, from each other, and that identify a parameter of an independent non-linear friction model with respect to each of the state amounts.

Solution to Problem

There is provided a friction identification method according to an aspect of the present invention that includes: a step of measuring a relation between a driving force and a position of a driven object; a step of identifying a parameter of a position-dependent friction model based on a relation between a driving force and a position of the driven object; a step of measuring a relation between a driving force and a displacement of the driven object from a position at which a motion direction is reversed; a step of identifying a parameter of a displacement-dependent friction model by using a relation between a driving force and a displacement of the driven object, and by using the position-dependent friction model; a step of measuring a relation between a driving force and a velocity of the driven object; a step of identifying a parameter of a velocity-dependent friction model by using a relation between a driving force and a velocity of the driven object, and by using the position-dependent friction model and the displacement-dependent friction model; a step of measuring a relation between a driving force and an acceleration of the driven object; and a step of identifying a parameter of an acceleration-dependent friction model by using a relation between a driving force and an acceleration of the driven object, and by using the position-dependent friction model, the displacement-dependent friction model, and the velocity-dependent friction model.

Advantageous Effects of Invention

According to the present invention, specified measurement steps are performed on a friction force that varies according to a plurality of state amounts, and therefore a parameter of a single-input single-output system friction model can be identified with respect to the respective state amounts in a reduced time. Further, by using the obtained model, it is possible to manage a change in the state amounts and obtain a friction correction model by which fine adjustments are likely to be performed.

BRIEF DESCRIPTION OF DRAWINGS

FIG. 5 is a table illustrating contents of a friction model according to the first and second embodiments.

DESCRIPTION OF EMBODIMENTS

Exemplary embodiments of a friction identification method and a friction identification device according to the present invention will be explained below in detail with reference to the accompanying drawings. The present invention is not limited to the embodiments.

First Embodiment

Figure 1:
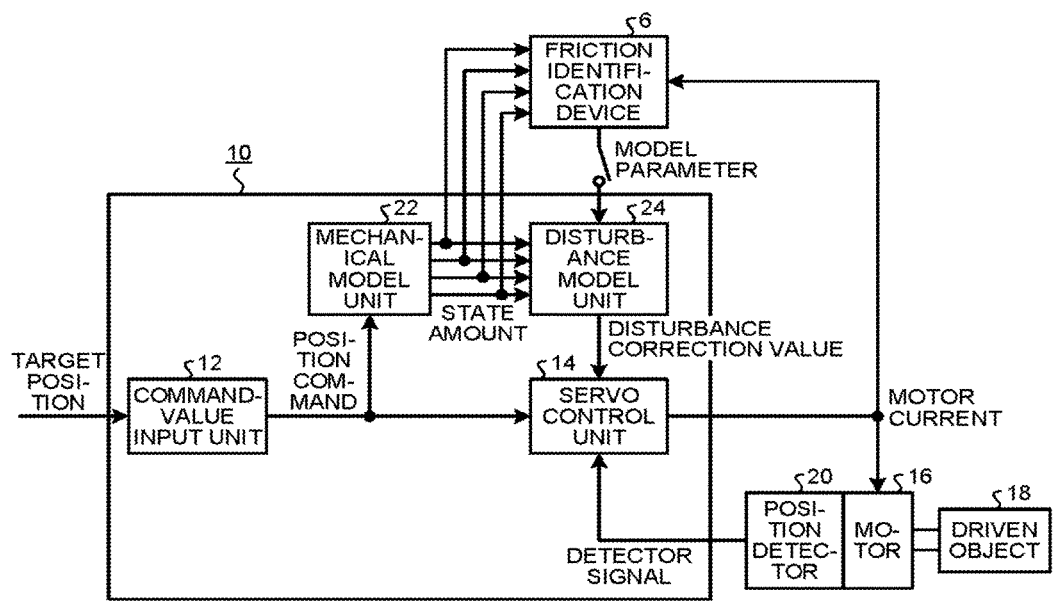
FIG. 1 is a block diagram illustrating a configuration example of a servo control device to which at friction identification device according to first to third embodiments of the present invention is applied, a motor, and a driven object.

FIG. 1 is a block diagram illustrating a configuration example of a servo control device 10 to which a friction identification device 6 according to the first to third embodiments of the present invention is applied, a motor 16, and a driven object 18. In order to perform friction correction, the friction identification device 6 identifies a parameter of a friction model based on measurement data of a friction generated in a device.

FIG. 1 illustrates the servo control device 10, the motor 16 in which its operation is controlled by the servo control device 10, a position detector 20 that is connected to the motor 16, and the driven object 18 that is driven by the motor 16. The servo control device 10 includes a command-value input unit 12, a servo control unit 14, a mechanical model unit 22, a disturbance model unit 24, and the friction identification device 6.

The command-value input unit 12 outputs a position command to the servo control unit 14 and the mechanical model unit 22 according to a target position of the driven object 18 inputted to the command-value input unit 12.

The servo control unit 14 executes a feedback control using a position command from the command-value input unit 12, a detector signal, (a detected position) from the position detector 20, and a disturbance correction value from the disturbance model unit 24. By outputting a motor current, (a driving current) to the motor 16, the servo control unit 14 controls motion of the driven object 18.

Figure 2:
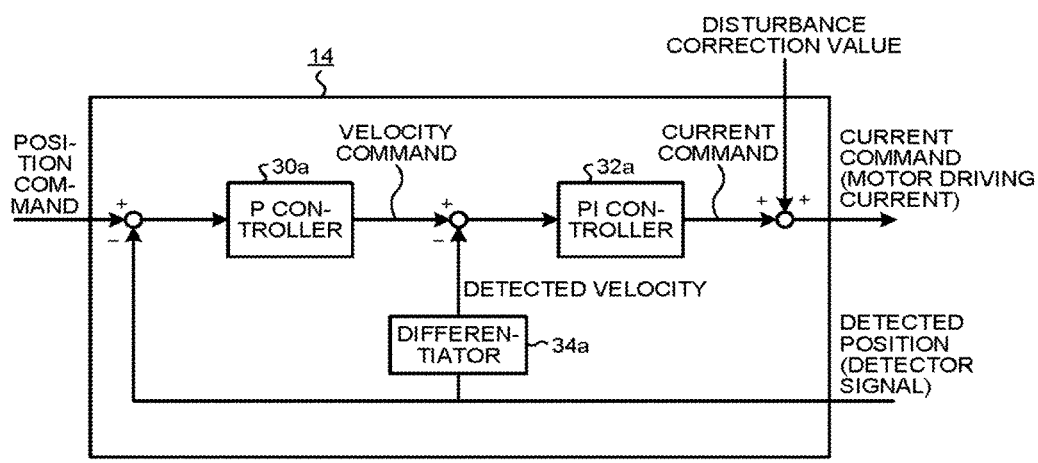
FIG. 2 is a block diagram illustrating a configuration of a servo control unit to which the present invention is applied in the first to third embodiments.

FIG. 2 is a block diagram illustrating a configuration of the servo control unit 14. The servo control unit 14 includes a proportional (P) controller 30a, a proportional-integral (PI) controller 32a, and a differentiator 34a. The servo control unit 14 has a position loop to be compensated for by the P controller 30a, and a velocity loop to be compensated for by the PI controller 32a.

The mechanical model unit 22 simulates a system including the servo control unit 14, the motor 16, and the driven object 18. The mechanical model unit 22 estimates and outputs four state amounts to the disturbance model unit 24, which are a position, a displacement, a velocity, and an acceleration of the driven object 18, based on a position command output by the command-value input unit 12.

Figure 3:
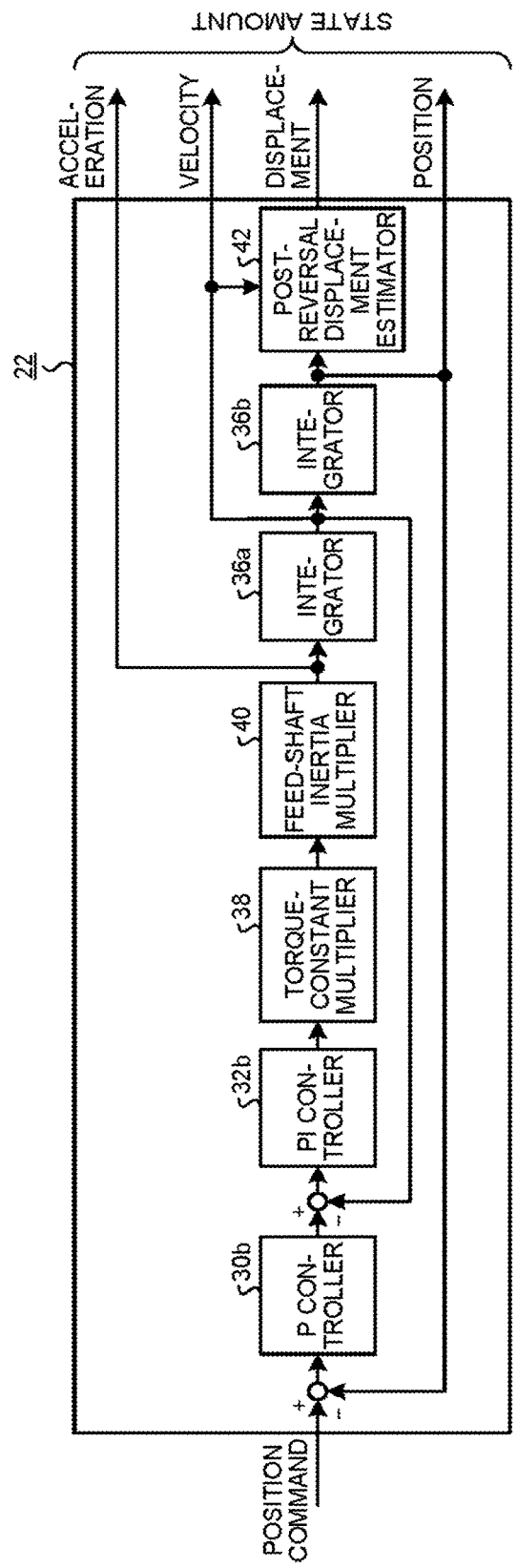
FIG. 3 is a block diagram illustrating a configuration of a mechanical model unit to which the present invention is applied in the first to third embodiments.

FIG. 3 is a block diagram illustrating a configuration of the mechanical model unit 22. The mechanical model unit 22 includes a P controller 30b, a PI controller 32b, a torque-constant multiplier 38, a feed-shaft inertia multiplier 40, an integrator 36a, an integrator 36b, and a post-reversal displacement estimator 42.

A position command from the command-value input unit 12, and an output of the integrator 36b are input to the P controller 30b. An output of the P controller 30b, and an output of the integrator 36a are input to the PI controller 32b. An output of the PI controller 32b is input to the torque-constant multiplier 38, and the torque-constant multiplier 38 calculates a motor torque from a motor-current command value, and output the motor torque.

An output of the torque-constant multiplier 38 is input to the feed-shaft inertia multiplier 40. An output of the feed-shaft inertia multiplier 40 is "acceleration" which is one of the state amounts to be output from the mechanical model unit 22. The inertia is calculated in advance. An output of the feed-shaft inertia multiplier 40 is input to the integrator 36a.

An output of the integrator 36a is "velocity" which is one of the state amounts to be output from the mechanical model unit 22. An output of the integrator 36a is input to the integrator 36b. An output of the integrator 36b is "position" which is one of the state amounts to be output from the mechanical model unit 22. An output of the integrator 36a that is "velocity" and an output of the integrator 36b that is "position" are input to the post-reversal displacement estimator 42. An output of the post-reversal displacement estimator 42 is "displacement" which is one of the state amounts to be output from the mechanical model unit 22.

In the manner as described above, the mechanical model unit 22 simulates feed-shaft motion which is performed when a position command is input, thereby calculating "position", "velocity", and "acceleration" of the feed shaft. The velocity and the position are input to the post-reversal displacement estimator 42 to output the displacement amount from the position at which an inversion of the velocity sign is detected.

The disturbance model unit 24 estimates a disturbance force from the four state amounts estimated by the mechanical model unit 22, and outputs the estimated disturbance force as a disturbance correction value to the servo control unit 14. The disturbance model unit 24 also receives data of a disturbance model from the friction identification device 6 as needed.

Figure 4:
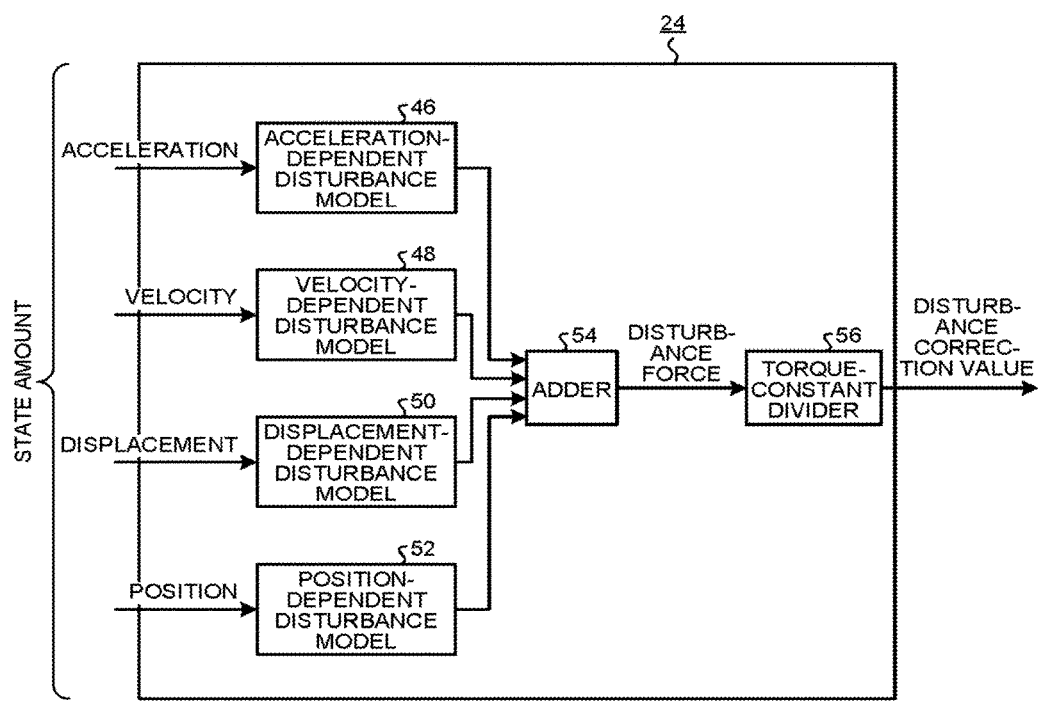
FIG. 4 is a block diagram illustrating a configuration of a friction model to be identified in the first to third embodiments.

FIG. 4 is a block diagram illustrating a configuration of the disturbance model unit 24. The disturbance model unit 24 includes an acceleration-dependent disturbance model 46, a velocity-dependent disturbance model 48, a displacement-dependent disturbance model 50, a position-dependent disturbance model 52, an adder 54 that adds outputs of these models, and a torque-constant divider 56 to which an output of the adder 54 is input as a disturbance force to output a disturbance correction value.

FIG. 5 illustrates examples of model parameters in the disturbance model unit 24. These models are provided in a data-table format for outputting a friction correction command that indicates a current correction value that uniquely corresponds to an input of the respective state amounts that are a position, a displacement, a velocity, and an acceleration. Due to this data-table format, without performing any approximation calculations, but by outputting model parameters as table data, a highly-accurate friction model can be obtained. When the input value is intermediate between the values in the data table, an interpolated disturbance correction value is output. For example, where a state-amount input "y" is between specified values $Y_i$ and $Y_{i+1}$ in a data table, a disturbance correction value $I_Y(y)$ with respect to a state amount Y in this model is expressed as the following equation (1). While in this example, the disturbance correction value is calculated by means of linear interpolation, the interpolation may be performed by another method such as spline interpolation.

[Equation 1]

$$I_Y(y) = \frac{I(Y_{i+1}) - I(Y_1)}{Y_{i+1} - Y_i}(y - Y_i) + I(Y_i) \tag{1}$$

In the manner as described above, relative to the respective state-amount inputs, a disturbance correction value is calculated. The adder 54 calculates a total current correction value. The torque-constant divider 56 converts the total current correction value to a motor current command.

Figure 6:
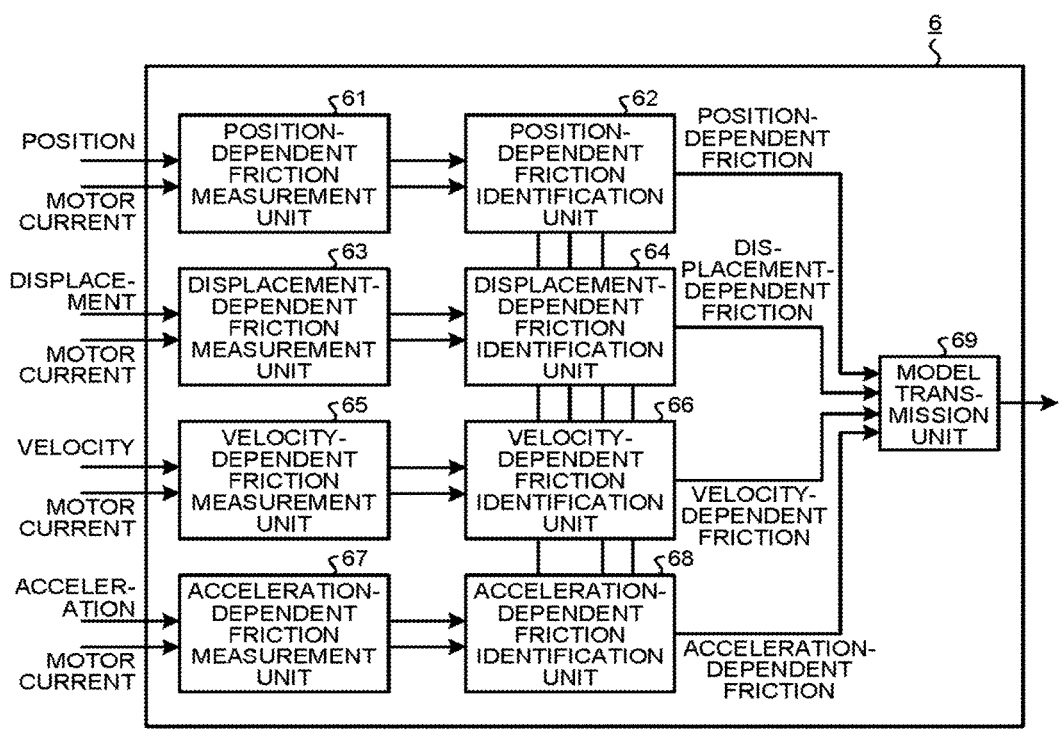
FIG. 6 is a block diagram illustrating a configuration of a friction identification device according to the first embodiment.

FIG. 6 is a block diagram illustrating a configuration of the friction identification device 6 that identifies parameters of the above friction models, and that transmits the model parameters to the disturbance model unit 24. To the friction identification device 6, a position, a displacement, a velocity, and an acceleration are input from the mechanical model unit 22, and also a motor current is input from the servo control unit 14. A position-dependent friction measurement unit 61 measures a relation between the position and the current when the servo control device 10 is driven in a specific motion pattern.

A position-dependent friction identification unit 62 identifies a position-dependent friction based on the measured relation between the position and the current, and outputs the position-dependent friction to a displacement-dependent friction identification unit 64, a velocity-dependent friction identification unit 66, an acceleration-dependent friction identification unit 68, and a model transmission unit 69. A displacement-dependent friction measurement unit 63 measures a relation between the displacement and the current when the servo control device 10 is driven in a specific motion pattern.

The displacement-dependent friction identification unit 64 receives inputs from the position-dependent friction identification unit 62 and the displacement-dependent friction measurement unit 63, respectively, and then identifies and outputs a displacement-dependent friction to the velocity-dependent friction identification unit 66, the acceleration-dependent friction, identification unit 68, and the model transmission unit 69. A velocity-dependent friction measurement unit 65 measures a relation between the velocity and the current when the servo control device 10 is driven in a specific motion pattern.

The velocity-dependent friction identification unit 66 receives inputs from the position-dependent friction identification unit 62, the displacement-dependent friction identification unit 64, and the velocity-dependent friction measurement unit 65, respectively, and then identifies and outputs a velocity-dependent friction to the acceleration-dependent friction identification unit 68 and the model transmission unit 69. An acceleration-dependent friction measurement unit 67 measures a relation between the acceleration and the current when the servo control device 10 is driven in a specific motion pattern.

The acceleration-dependent friction identification unit 68 receives outputs from the position-dependent friction identification unit 62, the displacement-dependent friction identification unit 64, the velocity-dependent friction identification unit 66, and the acceleration-dependent friction measurement unit 67, respectively, and then identifies and outputs an acceleration-dependent friction to the model transmission unit 69. The model transmission unit 69 transmits a model parameter to the disturbance model unit 24.

A method for identifying a parameter of a friction model expressed as a data table is described below. In the servo control unit 14, in a state where an output of the disturbance model unit 24 is made null, that is, a state where a disturbance correction value is set to zero, measurement of a friction force, and identification of a parameter of a friction model are performed. A total friction, force F applied to the device is defined, as the following equation (2) using a motor driving force "f", a driven-object mass "m", and an acceleration "a".

[Equation 2]

$$F = f - ma \quad (2)$$

The motor driving force "f" can be calculated as expressed by the following equation (3) using a motor current feedback value $I_m$ and a torque constant $K_t$.

[Equation 3]

$$f = K_t I_m \quad (3)$$

Figure 7:
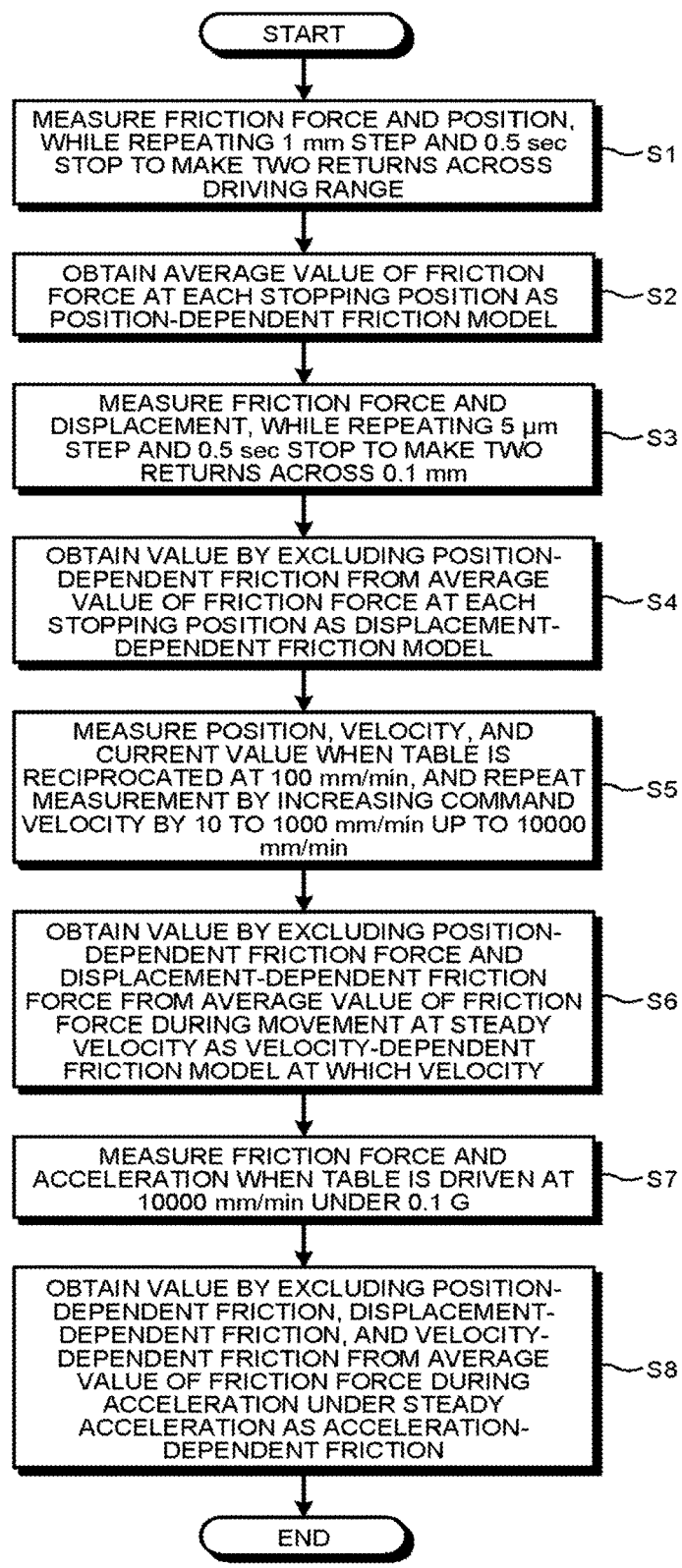
FIG. 7 is a flowchart illustrating a friction identification method according to the first embodiment.

Next, the total friction force F, the motor current feedback value $I_m$, and measurement results of a motor position X, a displacement, "d", a velocity "v", and the acceleration "a" at which time are used to identify, in stages, a parameter of each friction model that is dependent on each of the state amounts. A flowchart of the identification is illustrated in FIG. 7. In this identification process, the total friction force F generated in the device is assumed to vary with the four state amounts that are the position X, the displacement "d", the velocity "v", and the acceleration "a", as expressed by the following equation (4). Further, as expressed by the following equation (5), the total friction force F is separated into a friction $F_x$ that is dependent on the position X, a friction $F_d$ that is dependent on the displacement "d", a friction $F_v$ that is dependent on the velocity "v", and a friction $F_a$ that is dependent on the acceleration "a".

[Equation 4]

$$F = F(X, d, v, a) \quad (4)$$

[Equation 5]

$$F = F_X(X) + F_d(d) + F_v(v) + F_a(a) \quad (5)$$

Figure 8:
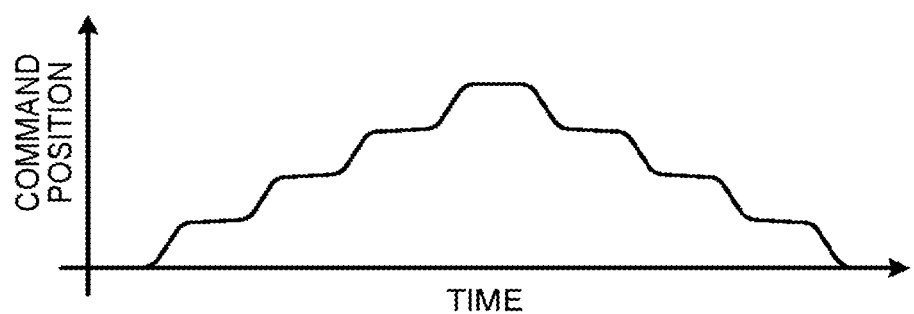
FIG. 8 is a diagram, illustrating an example of a position command at the time of measuring position-dependent friction and displacement-dependent friction according to the first to third embodiments.

At Step S1 of measuring a relation between the position and the friction force, a table that is the driven object 18 is driven while a minute movement and a stop are repeated. A friction force, which is calculated from the position, and the motor current feedback value during the repetition, is measured. FIG. 8 illustrates an example of a position command to be given. An optimal value of the step width and the stopping period to be instructed is varied based on the configuration of a measurement-target device. It is commonly known that generation of a friction force that varies depending on the position is caused due to a guide surface or run-out of a ball screw, and the friction force varies for approximately several millimeters basis. Accordingly, it is preferable to instruct a predetermined movement width of approximately from 0.5 millimeters to 5 millimeters. The stopping period is a time required for a friction force to be stabilized. The stopping period changes according to the stabilization time of a control system, or the lubrication state of a guide surface. Experientially, it is preferable to set the stopping period equal to or longer than 100 milliseconds. That is, the driven object 18 is moved by a predetermined movement width and stopped repeatedly within the driving range. The position of the driven object 18, and the driving force at which time are synchronously measured. The measurement is performed in this motion pattern, and therefore friction-force measurement data can be obtained. The measurement data includes data of a period in which it is possible to extract the influence of only the position-dependent friction, or the influence of only the displacement-dependent friction.

At Step S2, by using the measurement results at Step S1, a friction force that varies depending on the position is identified. At Step S1, while the table that is the driven object 18 is stopped, or when the velocity "v" is equal to or lower than a predetermined threshold that is close to zero, the velocity "v" and the acceleration "a" can both be regarded as zero. Therefore, when a period, during which the velocity of the table is equal, to or lower than the threshold, is detected, the velocity-dependent friction $F_v$ and the acceleration-dependent friction $F_a$ are both negligible during this period. Accordingly, friction components included in the total friction force F at the i-th stop point $X_i$ are expressed by the following equation (6).

[Equation 6]

$$F = F_X(X_i) + F_c \operatorname{sgn}(x) \quad (6)$$

In this equation, sgn represents sign function. Generally, in a displacement region of several hundreds of micrometers or greater from the position at which the motion direction is reversed, the displacement-dependent friction can be regarded as a constant Coulomb-friction force $F_c$. Because the value of the displacement is negative on the return path, the following equation (7) is obtained.

[Equation 7]

$$F=F_X(X_i)+F_c sgn(-x)=F_X(X_i)-F_c \qquad (7)$$

That is, the average value of the total friction force F on the outgoing and return paths is obtained from the equation (6) and the equation (7). Therefore, the position-dependent friction; force $F_x(X_i)$ at $X_t$ can be identified. That is, by performing the same calculation at each measurement point, a position friction model $F_x(X)$ that outputs a friction force that is in a one-to-one correspondence with the position is obtained. By using this identification method, it is possible to separate and identify the position-dependent friction from other friction components.

At Step S3, a relation between the displacement and the friction force is measured. At this step, identically to Step S1, the measurement is performed by driving the table by a minute movement width in the motion pattern illustrated in FIG. 8. Step S3 is different from Step S1 in that the command step width is made minute. The displacement-dependent friction $F_d$ shows non-linear characteristics within a displacement range of several hundreds of micrometers or less. Because in the displacement region of several hundreds of micrometers or greater, the displacement-dependent friction $F_d$ falls within the Coulomb-friction region, the friction force becomes a constant value. Therefore, in order to identify the non-linear characteristics of the displacement-dependent friction $F_d$, it is preferable to set the command width from several micrometers to several tens of micrometers.

At Step S4, the displacement-dependent friction is identified. Based on the equation (5), the total friction force F at the i-th stop point $d_i$ is expressed as the following equation (8).

[Equation 8]

$$F=F_X(X)+F_d(d_i) \qquad (8)$$

The position-dependent friction force $F_x$ has been identified at Step S3. Therefore, by using the method expressed as the following equation (9), a friction force $F_x(d_i)$ at the stop position is calculated and then subtracted from the total friction force to obtain the displacement-dependent friction force $F_d$. That is, the same calculation is performed at all the stop points, and therefore a displacement-dependent friction model $F_d$ that outputs a friction force that is in a one-to-one correspondence with the displacement "d" is obtained. By using this identification method, it is possible to separate and identify the displacement-dependent friction from other friction components.

[Equation 9]

$$F_d(d_i)=F-F_X(X) \qquad (9)$$

Figure 9:
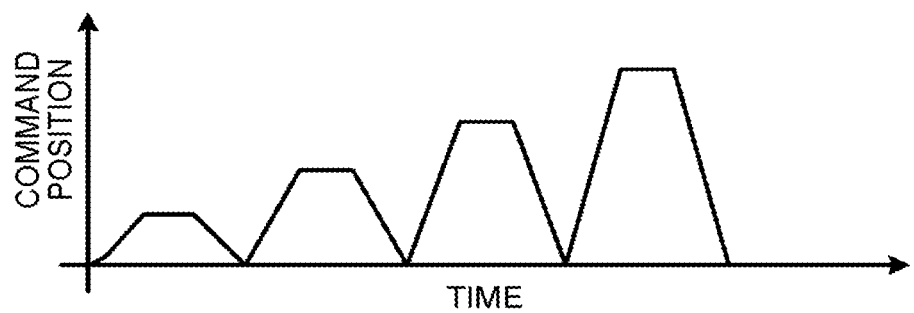
FIG. 9 is a diagram illustrating an example of a position command at the time of measuring velocity-dependent friction according to the first embodiment.

At Step S5, a relation between the velocity and the friction force is measured. FIG. 9 illustrates an example of a position command to be given. At Step S5, while changing the command velocity for the table that is the driven object 18, reciprocating motion is repeated by a predetermined movement width at a predetermined velocity and a predetermined acceleration. The total friction force F, the table position X, and the velocity "v" during this repetition are measured. It is generally thought that a velocity-dependent friction force shows a non-linear behavior when the command velocity is several hundreds mm/min or less, and shows an almost linear behavior when the command velocity is several hundreds mm/min or greater. Therefore, when the command velocity is several hundreds mm/min or less, it is preferable to perform the measurement while changing the command velocity by approximately 10 mm/min. In contrast, in the command-velocity region of several hundreds mm/min or greater, it is adequate to perform the measurement while changing the command velocity in a stepwise fashion by 100 to 1000 mm/min from the viewpoint of a reduction in the measurement time. In this manner, the above reciprocating motion is repeated while changing either the velocity or the acceleration, or changing both the velocity and the acceleration, to synchronously measure the position of the driven object 18 and the driving force during the repetition. The measurement is performed in this motion pattern, and therefore friction-force measurement data can be obtained. The measurement data includes data of a time point at which it is possible to extract the influence of only the velocity-dependent friction, or the influence of only the acceleration-dependent friction.

In the position command illustrated in FIG. 9, movement distances are set such that the measurement periods become equal to each other when the table moves respective periods at corresponding respective constant velocities. However, when the command velocity is high, there is a possibility that the measurement is not finished within the driving range. Therefore, when the measurement is performed at a high command velocity, it is preferable to set the maximum instructable acceleration and perform the measurement through the entire driving range.

At Step 36, the velocity-dependent friction force $F_v$ is identified. Because the acceleration is zero during movement at a constant velocity, the velocity-dependent friction force $F_v$ at the i-th command velocity "$v_i$" is obtained from the following equation (10) using the equation (5). That is, the measurement is performed at all the command velocities, and therefore the velocity-dependent friction model $F_v$ that outputs a friction force that is in a one-to-one correspondence with the velocity "v" is obtained.

[Equation 10]

$$F_v(v_i)=F-F_X(X)-F_d(d) \qquad (10)$$

At Step S7, a relation between the acceleration and the friction force is measured. At this Step, while changing the command acceleration for the table, simple reciprocating motion is repeated. The total friction force F, the table position X, the velocity "v", and the acceleration "a" are measured during the reciprocation. Generally, an acceleration-dependent friction force is more likely to be influential when the acceleration is approximately 2 G or less. Therefore, it is preferable to perform the measurement while changing the command acceleration in a stepwise fashion by approximately 0.1 G. Nonetheless, when the acceleration is excessively low, the acceleration-dependent friction is less influential and the identification is sometimes difficult. Accordingly, it is sufficient that the lower limit of the command acceleration is approximately 0.01 G to 0.05 G. As the command velocity is higher, a longer time is required for acceleration, and consequently the measurement accuracy is improved. It is thus preferable to perform the measurement at the maximum instructable velocity.

At Step S8, the acceleration-dependent friction $F_a$ is identified. That is, a period during which the acceleration of the driven object 18 is constant is detected, and based on the total, friction force F during this period, it is possible to calculate the friction force at the i-th command acceleration by using the equation (5) as expressed by the following equation (11). With this calculation, it is possible to separate and identify the acceleration-dependent friction from the measured friction force.

[Equation 11]

$$F_a(a_i)=F-F_X(X)-F_d(d)-F_v(v) \qquad (11)$$

As described above, in a device having a function of correcting a disturbance force such as a friction force by using a model in such a manner that the position and velocity of a driven object correspond with its target position and target velocity, the aforementioned procedure is used as a friction identification method for identifying a parameter of a friction model to be used for the correction.

With this method, a position-dependent friction can be identified by using a measurement pattern that is capable of separating only a position friction force from a friction force that varies according to a plurality of state amounts such as a position, a displacement, a velocity, and an acceleration. In the same manner as the position-dependent friction, a displacement-dependent friction, a velocity-dependent friction, and an acceleration-dependent friction can also be measured and separated from the friction force in succession. It is therefore possible to efficiently identify a model. That is, it is possible to efficiently identify, in stages, parameters of respective models of a friction force that changes depending on the position, displacement, velocity, and acceleration.

That is, by using the friction identification method according to the present embodiment, it is possible to extract friction-force components in succession, each of which varies depending con a single state amount such as a position, a displacement, a velocity, or an acceleration, from the total friction force of a driven object that is generated due to variations in a plurality of state amounts. Therefore, it is possible to identify a model parameter. Due to this method, a friction identification device can be achieved, that is capable of identifying a position-dependent friction, a displacement-dependent friction, a velocity-dependent friction, and an acceleration-dependent friction.

Second Embodiment

Figure 10:
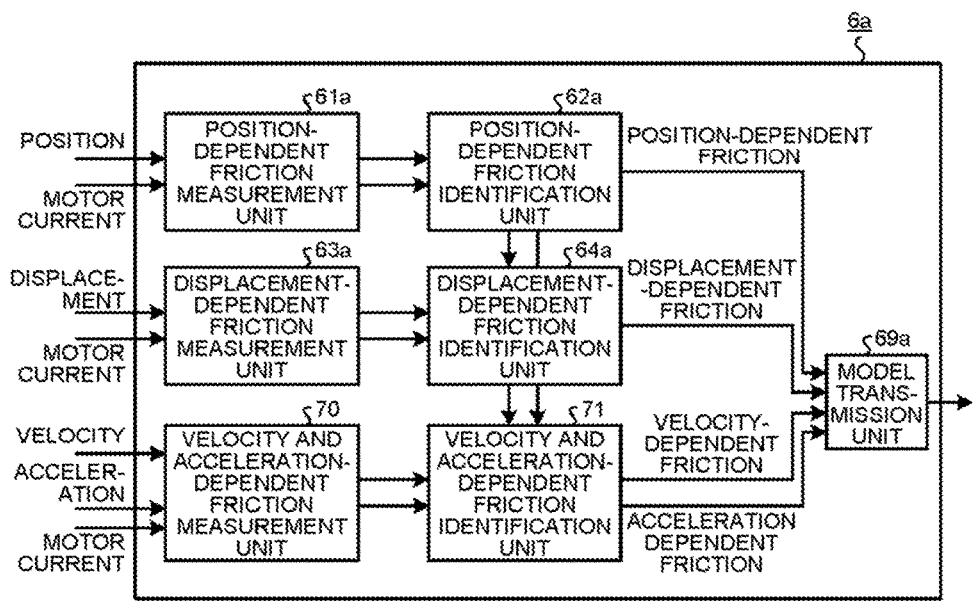
FIG. 10 is a block diagram of a configuration of a friction identification device according to the second embodiment.

FIG. 10 is a block diagram of a configuration of a friction identification device 6a according to a second embodiment of the present invention. FIG. 10 is different from FIG. 6 in that a velocity and acceleration-dependent friction measurement unit 70 has a function of the velocity-dependent friction measurement unit 65 and the acceleration-dependent, friction measurement unit 67 in FIG. 6, and a velocity and acceleration-dependent friction identification unit 71 has a function of the velocity-dependent friction identification unit 66 and the acceleration-dependent friction identification unit 68 in FIG. 6.

Figure 11:
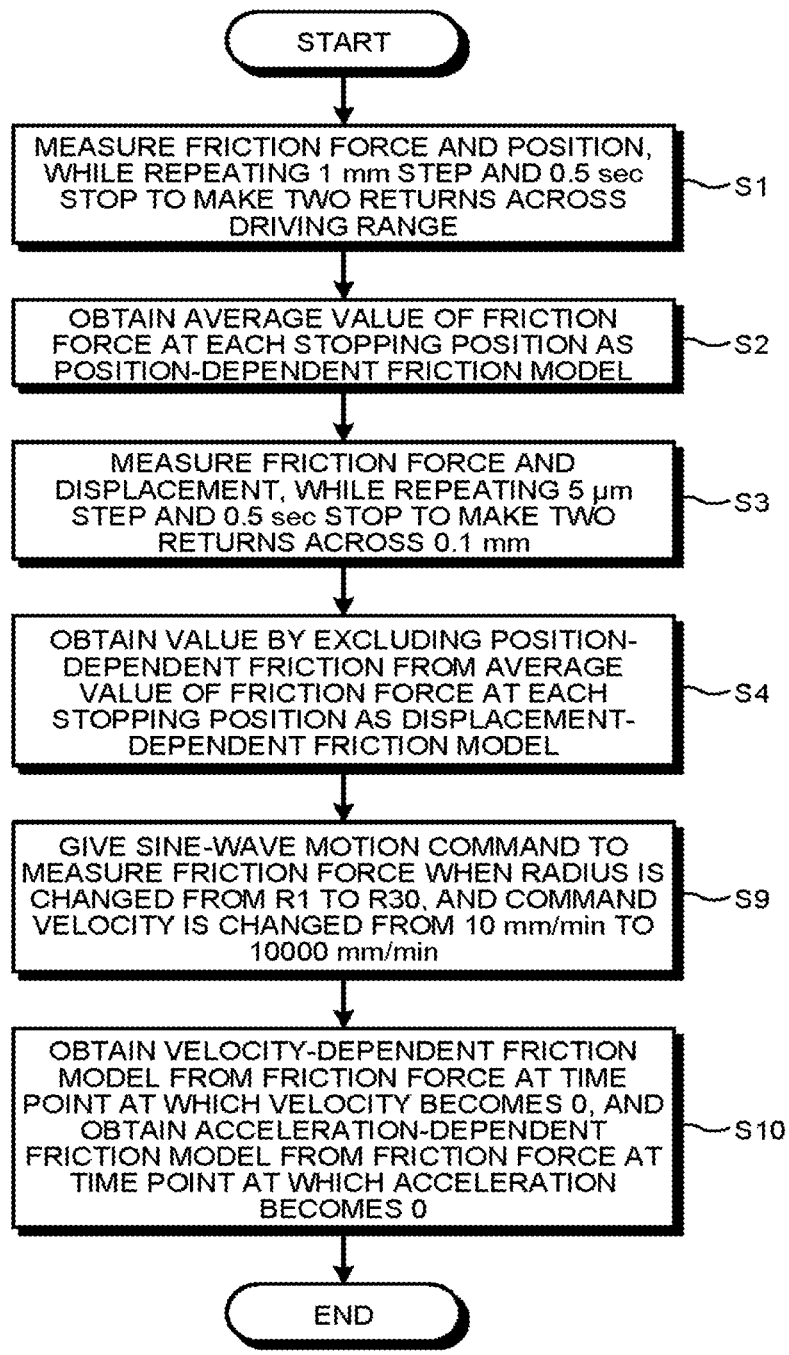
FIG. 11 is a flowchart illustrating a friction identification method according to the second embodiment.

A specific flowchart of the friction identification method is illustrated in FIG. 11. Steps S1 to S4 in FIG. 11 are identical to Steps S1 to S4 in FIG. 7. The flowchart is different from the first embodiment in that a velocity-dependent friction and an acceleration-dependent friction are measured and identified simultaneously at Step S9 and Step S10 in FIG. 11.

Specifically, at Step S9 in FIG. 11, a sine-wave motion command is used in order to measure and identify the velocity-dependent friction and the acceleration-dependent friction simultaneously. That is, a sine-wave motion command is given to measure a friction force when the radius is changed from R1 to R30, and the command velocity is changed from 10 mm/min to 10000 mm/min. It is possible to draw an arc path by giving sine-wave commands the phases of which are shifted by a 90-degree one another to two control devices. Therefore, a sine-wave command is frequently used in machine tools.

Figure 12:
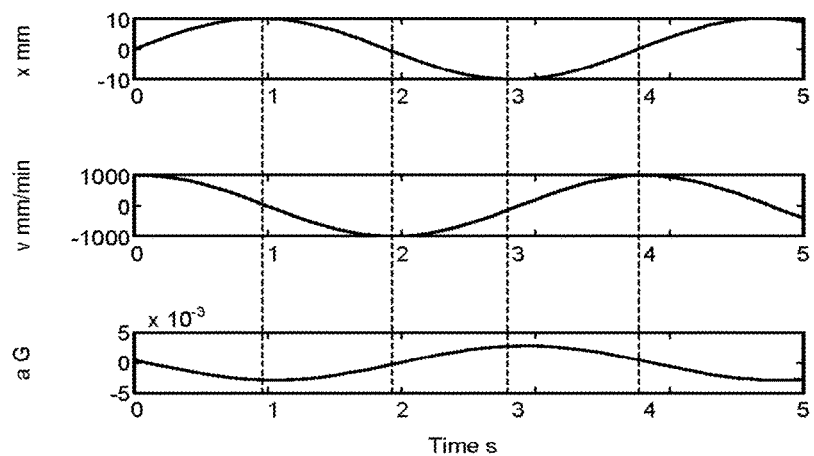
FIG. 12 is a diagram illustrating a motion pattern used for identification of velocity-dependent friction and acceleration-dependent friction according to the second embodiment.

Time waveforms of the position, velocity, and acceleration of the table generated when a sine-wave command is given are illustrated in FIG. 12. The acceleration "a" on an arc-motion path is calculated from a radius R of the arc, and an arc-encircling velocity "v", as expressed by the following equation (12).

[Equation 12]

$$a = \frac{v^2}{R} \qquad (12)$$

By changing the command velocity and the arc radius, it is possible to measure a friction force while changing the velocity "v" and the acceleration "a" independently.

In a sine-wave command, each time the phase changes by 90 degrees, there are alternately a time point at which the velocity becomes zero, and a time point at which the acceleration becomes zero. In FIG. 12, the time points, at which the velocity or the acceleration becomes zero, are illustrated by the dotted line. At Step S10 in FIG. 11, from a measured friction force at the time point at which the velocity becomes zero, that is, in the period during which the velocity becomes a predetermined threshold or lower, the velocity-dependent friction model $F_v$ can be identified by using the method expressed as the equation (10). At the time point at which the acceleration becomes zero, that is, in the period during which the acceleration becomes a predetermined threshold or lower, the acceleration-dependent friction model $F_a$ can be identified from the following equation (13).

[Equation 13]

$$F_a(a_i)=F-F_X(X)-F_d(d) \qquad (13)$$

The measurement is performed in this motion pattern, and therefore it is possible to alternately extract the influence of only the velocity-dependent friction, and the influence of only the acceleration-dependent friction, each time the sine-wave phase changes by 90 degrees. That is, friction-force measurement data that includes data of time points at which it is possible to alternately extract the influence of only the velocity-dependent friction and the influence of only the acceleration-dependent friction. It is also possible to separate and identify the velocity-dependent friction from the measured friction force.

In the present embodiment, it is possible to measure an acceleration-dependent friction and at velocity-dependent friction simultaneously, that is, to measure and identify an influence of friction forces that are respectively dependent on the velocity and the acceleration at a time. This produces have the effect of identifying a parameter of a friction model in a reduced time as compared to the first, embodiment.

Third Embodiment

Figure 13:
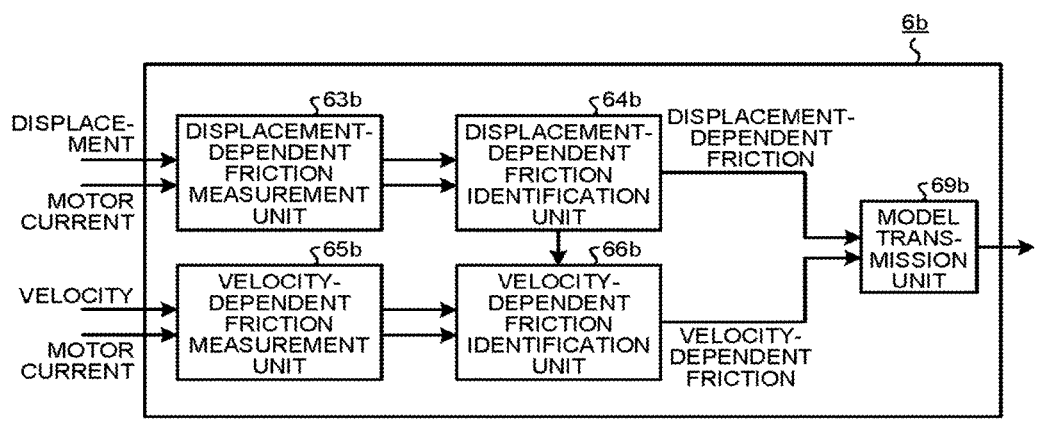
FIG. 13 is a block diagram illustrating a configuration of a friction identification device according to the third embodiment.

FIG. 13 is a block diagram illustrating a configuration of at friction identification device 6b according to a third embodiment of the present invention. In FIG. 13, there are not functional blocks that correspond to the position-dependent friction measurement unit 61, the position-dependent friction identification unit 62, the acceleration-dependent friction measurement unit 67, and the acceleration-dependent friction identification unit 68, which are illustrated in FIG. 6. That is, the friction identification device 6b is different from the first embodiment in that a step of measuring and identifying a position-dependent friction and an acceleration-dependent friction is omitted.

In a device assembled with high accuracy, an influence of the position-dependent friction is almost negligible in some cases. In these cases, it is adequate that a position-dependent friction identification process is omitted.

In a case where the device is configured using a rolling guide and a ball screw, or using a rolling guide and a linear motor, the acceleration-dependent friction is less influential. Therefore, when the device is configured as described above, measurement and identification of the acceleration-dependent friction can be omitted.

That is, in a servo control device assembled with high accuracy, and configured using a rolling guide and a ball screw, or using a rolling guide and a linear motor, a position-dependent friction and an acceleration-dependent friction are sometimes negligible. In such a case as described, it is adequate that measurement and identification process of a displacement-dependent friction, and measurement and identification process of a velocity-dependent friction are only performed. This produces the effect of reducing the measurement time and the friction identification time.

Fourth Embodiment

Figure 14:
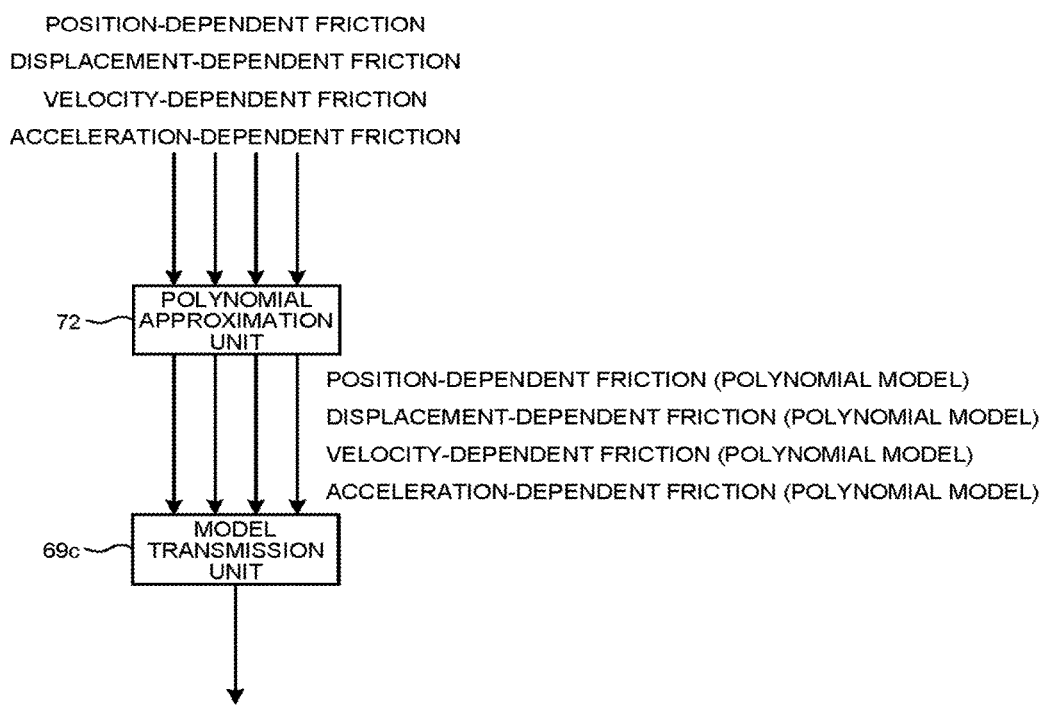
FIG. 14 is a block diagram illustrating a part of a configuration of at friction identification unit according to a fourth embodiment.

FIG. 14 is a block diagram illustrating a part of a configuration of a friction identification unit according to a fourth embodiment of the present invention. In the fourth embodiment, a friction measurement and identification method is the same as in the first, second, and third embodiments. The fourth embodiment is different from the first, second, and third embodiments in that a position-dependent friction, a displacement-dependent friction, a velocity-dependent friction, and an acceleration-dependent friction, which have been respectively output from the position-dependent, friction identification unit 62, the displacement-dependent friction identification unit 64, the velocity-dependent friction identification unit 66, and the acceleration-dependent friction identification unit 68, are then input to a polynomial approximation unit 72. Data tables of the obtained friction forces are approximated by polynomials, respectively, to polynomial models in the polynomial approximation unit 72 and the polynomial models as friction models are outputted from a model transmission unit 69c.

As a polynomial approximation algorithm, many methods have already been revealed, such as a method using the least squares. Therefore, detailed descriptions of the polynomial approximation method are omitted. From the viewpoint of calculation time, it is preferable to approximate a friction force by approximately the tenth-order or lower-order polynomial.

Due to this embodiment, a model can be obtained by a smaller number of parameters as compared to using table data. Therefore, the number of parameters to be transmitted to the disturbance model unit 24 can be reduced as compared to transmitting a data table.

As described above, in a function of correcting a friction force by using a model in a device that controls the position and velocity of a driven object so as to correspond with its target position and target velocity, the friction identification method and the friction identification device that identify a parameter of a friction model to be used for the correction in the first to fourth embodiments measure and separate an influence of a single state amount on a friction force that varies according to a plurality of state amounts such as a position, a displacement, a velocity, and an acceleration, from the friction force in succession. This makes it possible to efficiently identify a parameter of the friction model.

Furthermore, the invention of the present application is not limited to the above embodiments, and when the present invention is carried out, the invention can be variously modified without departing from the scope thereof. Further, in the above embodiments, inventions of various stages are included, and various inventions can be extracted by appropriately combining a plurality of constituent elements disclosed herein. For example, even when some constituent elements are omitted from all the constituent elements described in the embodiments, as far as the problems mentioned in the section of Solution to Problem can be solved and effects mentioned in the section of Advantageous Effects of Invention are obtained, the configuration from which some constituent elements have been omitted can be extracted as an invention. In addition, constituent, elements mentioned in different embodiments can be appropriately combined with each other.

INDUSTRIAL APPLICABILITY

As described above, the friction identification method and the friction identification device according to the present invention can be used for controlling a machine tool or a robot that is driven by a control device such as a numerical control device. Particularly, the friction identification method and the friction identification device according to the present invention are applicable to identifying a parameter of a friction model in a feed system in which the device is required to achieve both a load capacity and machining accuracy.

REFERENCE SIGNS LIST 10 servo control device, 12 command-value input unit, 14 servo control unit, 16 motor, 18 driven object, 20 position detector, 22 mechanical model unit, 24 disturbance model unit, 30a, 30b P controller, 32a, 32b PI controller, 34a differentiator, 36a, 36b integrator, 38 torque-constant multiplier, 40 feed-shaft inertia multiplier, 42 post-reversal displacement estimator, 46 acceleration-dependent disturbance model, 46 velocity-dependent disturbance model, 50 displacement-dependent disturbance model, 52 position-dependent disturbance model, 54 adder, 56 torque-constant divider, 6, 6a, 6b friction identification device, 61, 61a position-dependent friction measurement unit, 62, 62a position-dependent friction identification unit, 63, 63a, 63b displacement-dependent friction measurement, unit, 64, 64a, 64b displacement-dependent friction identification unit, 65, 65b velocity-dependent friction measurement unit, 66, 66b velocity-dependent friction identification unit, 67 acceleration-dependent friction measurement unit, 68 acceleration-dependent friction identification unit, 69, 69a, 69b, 69c model transmission unit, 70 velocity and acceleration-dependent friction measurement unit, 71 velocity and acceleration-dependent friction identification unit, 72 polynomial approximation unit, S1 to S10 step.

The invention claimed is:
1. A friction identification method performed by a fiction identification device that is connected to a control device which drives a motor to drive a driven object, the friction identification method comprising:
  receiving a position, a displacement, a velocity, and an acceleration of the driven object, and a driving force from the control device;
  measuring a relation between a driving force and a position of the driven object;
  identifying; a parameter of a position-dependent friction model based on a relation between a driving force and a position of the driven object;
  measuring a relation between a driving force and a displacement of the driven object from a position at which a motion direction is reversed;
  identifying; a parameter of a displacement-dependent friction model by using a relation between a driving force and a displacement of the driven object, and by using the position-dependent friction model;
  measuring a relation between a driving force and a velocity of the driven object;
  identifying a parameter of a velocity-dependent friction model by, using a relation between a driving force and a velocity of the driven object, and by using the position-dependent friction model and the displacement-dependent friction model;
  measuring a relation between a driving force and an acceleration of the driven object;
  identifying a parameter of an acceleration-dependent friction model by using a relation between a driving force and an acceleration of the driven object, and by using the position-dependent friction model, the displacement-dependent friction model, and the velocity-dependent friction model and
  outputting the parameters of the position-dependent friction model, the displacement-dependent friction model, the velocity-dependent friction model, and the acceleration-dependent friction model to the control device so that the control device drives the driven object using the parameters of the fiction models, each of the friction model being depending on a single state amount of the position, the displacement, the velocity, or the acceleration.

2. The friction identification method according to claim 1, wherein at the measuring the relation between a driving force and a position of the driven object, and at the measuring the relation between a driving force and a displacement of the driven object from a position at which a motion direction is reversed, the driven object is moved by a predetermined movement width and stopped repeatedly within a driving range of the driven object, to synchronously measure positions of the driven object and driving forces during the repetition.

3. The friction identification method according to claim 1, wherein at the identifying the parameter of a position-dependent friction model based on a relation between a driving force and a position of the driven object, a period, during which a velocity of the driven object becomes equal to or lower than a predetermined threshold, is detected to output a friction force in the period as a position-dependent fiction force at a position of the driven object.

4. The friction identification method according to claim 3, wherein at the identifying the parameter of the displacement-dependent friction model, a value that is obtained by excluding a friction force at a position of the driven object, which is calculated by using the position dependent friction model, from the driving force is output as a displacement-dependent friction force at a displacement of the driven object.

5. The friction identification method according to claim 1, wherein the measuring the relation between a driving force and a velocity of the driven object, and the measuring the relation between a driving force and an acceleration of the driven object are performed simultaneously.

6. The friction identification method according to claim 1, wherein at the measuring the relation between a driving force and a velocity of the driven object and at the step of measuring a relation between a driving force and an acceleration of the driven object, the driven object is reciprocated by a predetermined movement width within a driving range of the driven object at a predetermined velocity and a predetermined acceleration, and the reciprocation is repeated while changing either a velocity or an acceleration, or changing both a velocity and an acceleration, to synchronously measure positions of the driven object and driving forces during the reciprocation.

7. The friction identification method according to claim 5, wherein when the measuring the relation between a driving force and a velocity of the driven object, and the measuring the relation between a driving force and an acceleration of the driven object are performed simultaneously, a sine-wave motion command is given to the driven object.

8. The friction identification method according to claim 1, wherein at the identifying the parameter of the velocity-dependent friction model, a period, during winch an acceleration of the driven object becomes equal to or lower than a predetermined threshold is detected and a value obtained by excluding both a friction force at a position of the driven object, calculated by using the position-dependent friction model, and a friction force at a displacement of the driven object, calculated by using the displacement-dependent friction model, from a friction force in the period is output as a velocity-dependent friction force at a velocity of the driven object.

9. The friction identification method according to claim 1, wherein at the identifying the parameter of the acceleration-dependent friction model, a period, during which an acceleration of the driven object is constant, is detected and a value obtained by excluding a friction force at a position of the driven object, calculated by using the position-dependent friction model, a friction force at a displacement of the driven object, calculated by using the displacement-dependent friction model, and a friction force at a velocity of the driven object, calculated by using the velocity-dependent friction model, from a friction force in the period is output as an acceleration-dependent friction force at an acceleration of the driven object.

10. The friction identification method according to claim 1, further comprising outputting a parameter of the friction model.

11. A friction identification device that is connected to a control device which drives a motor to drive a driven object comprising:
  a position-dependent friction measurement sensor that receives a position of the driven object and a driving farce from the control device and measures a relation between a driving force and the position of driven object;
  a position-dependent friction identification module implemented by processing circuitry configured to identify a parameter of a position-dependent friction model based on a relation between a driving force and a position of the driven object;
  a displacement-dependent friction measurement sensor that receives a displacement of the driven object and the driving force from the control device, and measures a relation between a driving force and the displacement of the driven object from a position at which a motion direction is reversed;

a displacement-dependent friction identification module implemented by the processing circuitry configured to identify a parameter of a displacement-dependent friction model by using a relation between a driving force and a displacement of the driven object, and by using the position-dependent friction model;

a velocity-dependent friction measurement sensor that receiving a velocity of the driven object and the driving force from the control device, and measures a relation between a driving force and a velocity of the driven object;

a velocity-dependent friction identification module implemented by the processing circuitry configured to identify a parameter of a velocity-dependent friction model by using a relation between a driving force and a velocity of the driven object, and by using the position-dependent friction model and the displacement-dependent friction model;

an acceleration-dependent friction measurement sensor that receives an acceleration of the driven object and the driving force from the control device, and measures a relation between a driving force and an acceleration of the driven object;

an acceleration-dependent friction identification module implemented by the processing circuitry configured to identify a parameter of an acceleration-dependent friction model by using a relation between a driving force and an acceleration of the driven object, and by using the position-dependent friction model, the displacement-dependent friction model, and the velocity-dependent friction model; and a model transmission module implemented by the processing circuitry configured to output parameters of the position-dependent friction model, the displacement-dependent friction model, the velocity-dependent friction model, and the acceleration-dependent friction model, respectively, to the control device so that the control device drives the driven object using the parameters of the friction models, each of the friction model being depending on a single state amount of the position, the displacement, the velocity, or the acceleration.

12. A model-based friction force correction method, comprising:

measuring a relation between a driving force and a position of a driven object;

identifying a first parameter of a position-dependent friction model based on a relation between a driving force and a position of the driven object;

measuring a relation between a driving force and a displacement of the driven object from a position at which a motion direction is reversed;

identifying a second parameter of a displacement-dependent friction model by using a relation between a driving force and a displacement of the driven object, and by using the position-dependent fiction model;

measuring a relation between a driving force and a velocity of the driven object;

identifying a third parameter of a velocity-dependent friction model by using a relation between a driving force and a velocity of the driven object, and by using the position-dependent friction model and the displacement-dependent friction model;

measuring a relation between a driving force and an acceleration of the driven object;

identifying a fourth parameter of an acceleration-dependent friction model by using a relation between a driving force and an acceleration of the driven object, and by using the position-dependent friction model, the displacement-dependent friction model, and the velocity-dependent friction model; and correcting, using processing circuitry, for an influence of the friction force on an accuracy of a contouring motion when performing feedback control for an electric motor based on the first, second, third and fourth parameters of respective friction models.

* * * * *